United States Patent
Cavallaro et al.

(10) Patent No.: US 9,913,392 B2
(45) Date of Patent: Mar. 6, 2018

(54) FLEXIBLE DISPLAY STACK-UP AND METHOD FOR ARRANGING

(71) Applicant: MOTOROLA MOBILITY LLC, Chicago, IL (US)

(72) Inventors: Alberto R Cavallaro, Northbrook, IL (US); Roger W Harmon, Crystal Lake, IL (US)

(73) Assignee: MOTOROLA MOBILITY LLC, Chicago, IL (US)

( * ) Notice: Subject to any disclaimer, the term of this patent is extended or adjusted under 35 U.S.C. 154(b) by 0 days.

(21) Appl. No.: 15/097,388

(22) Filed: Apr. 13, 2016

(65) Prior Publication Data

US 2017/0303423 A1 Oct. 19, 2017

(51) Int. Cl.
G06F 1/16 (2006.01)
H05K 7/14 (2006.01)

(52) U.S. Cl.
CPC ............ H05K 7/1422 (2013.01); G06F 1/16 (2013.01)

(58) Field of Classification Search
CPC .... G06F 3/0488; G06F 1/1643; G06F 1/1637; G06F 1/16; G06F 1/1601; G06F 1/1626; G06F 1/1632; G06F 1/1616; G06F 1/1656; G06F 1/18; G06F 1/181; H05K 5/0017; H05K 13/00; H05K 13/046; H05K 7/1422; H05K 5/00; Y02E 60/12
USPC ............ 361/679.01, 679.21, 679.26, 679.22, 361/679.27; 455/575.1–575.5; 349/58–60
See application file for complete search history.

(56) References Cited

U.S. PATENT DOCUMENTS

| | | | | |
|---|---|---|---|---|
| 5,177,629 A | * | 1/1993 | Bohannon | G02F 1/133502 349/117 |
| 2004/0017528 A1 | * | 1/2004 | Kano | G02F 1/133553 349/113 |
| 2007/0248811 A1 | * | 10/2007 | Hwong | G03B 21/60 428/323 |
| 2009/0103024 A1 | * | 4/2009 | Kuo | G02F 1/1333 349/110 |
| 2009/0244456 A1 | | 10/2009 | Miyazaki et al. | |
| 2014/0077201 A1 | * | 3/2014 | Becker | H01L 51/107 257/40 |
| 2014/0168880 A1 | | 6/2014 | Saila et al. | |

(Continued)

OTHER PUBLICATIONS

"Extended European Search Report", EP Application No. 17163979.2, Jul. 4, 2017, 10 pages.

Primary Examiner — Anthony Haughton
Assistant Examiner — Ingrid Wright

(57) ABSTRACT

A display stack-up for an electronic device has: multiple layers that include a display layer and a second layer; and an outer seal. Each layer has first and second base surfaces and a thickness therebetween defining a height of a lateral surface at a periphery of the layer. The multiple layers are stacked along an axis perpendicular to their base surfaces and parallel to their lateral surfaces, and the outer seal is positioned along the lateral surface of at least some of the multiple layers. The outer seal is composed of a flexible material and is arranged to bind the second layer and at least one other layer of the multiple layers. The outer seal also contains a non-adhesive liquid between the second layer and the at least one other layer to allow relative sliding between at least two layers of the multiple layers.

20 Claims, 10 Drawing Sheets

(56) References Cited

U.S. PATENT DOCUMENTS

2016/0179276 A1* 6/2016 Nathan ................. G06F 3/0414
　　　　　　　　　　　　　　　　　　　　345/174
2016/0334898 A1* 11/2016 Kwak ................... G06F 3/0412

* cited by examiner

FLEXIBLE DISPLAY STACK-UP AND METHOD FOR ARRANGING

FIELD OF THE DISCLOSURE

The present disclosure relates generally to flexible systems and more specifically to a flexible display stack-up for an electronic device.

BACKGROUND

There is a strong interest in foldable electronic devices to enable larger displays within a pocketable form factor. However, the ability to bend a structure is limited by its stiffness and stress to failure. For example, the stiffness and stress to failure creates a challenge in integrating a display with additional layers such as a touch panel and protective layers.

BRIEF DESCRIPTION OF THE FIGURES

The accompanying figures, where like reference numerals refer to identical or functionally similar elements throughout the separate views, form part of the specification and illustrate embodiments in accordance with the included claims.

Figure 1:
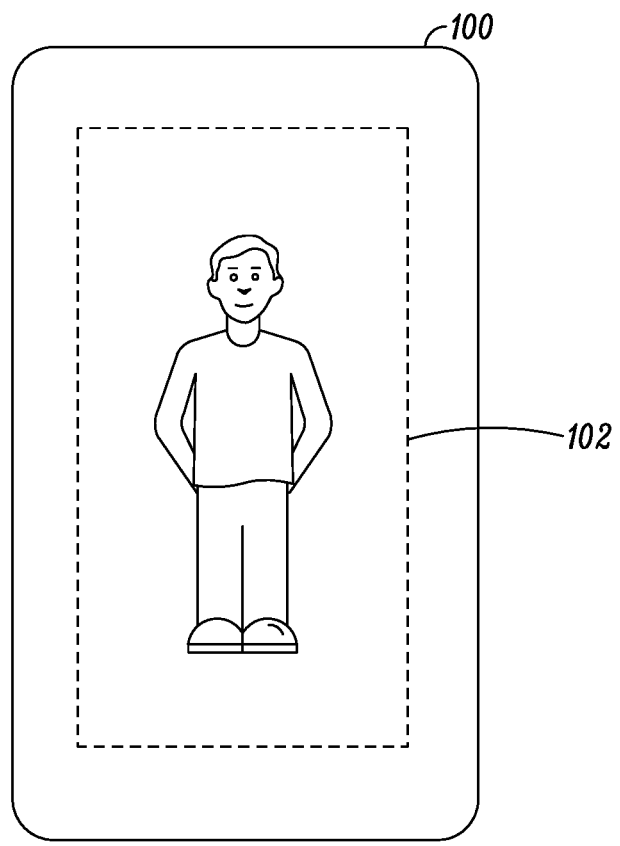
FIG. 1 shows a pictorial diagram that includes an electronic device having a flexible display stack-up, in accordance with some embodiments.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present teachings. In addition, the description and drawings do not necessarily require the order presented. It will be further appreciated that certain actions and/or steps may be described or depicted in a particular order of occurrence while those skilled in the art will understand that such specificity with respect to sequence is not actually required.

The apparatus and method components have been represented, where appropriate, by conventional symbols in the drawings, showing only those specific details that are pertinent to understanding the embodiments of the present teachings so as not to obscure the disclosure with details that will be readily apparent to those of ordinary skill in the art having the benefit of the description herein.

DETAILED DESCRIPTION

Generally speaking, pursuant to various embodiments described herein, a flexible display stack-up for an electronic device is arranged to have: multiple layers that include at least a display layer and a second layer; and an outer seal. The multiple layers are stacked along a first axis perpendicular to their base surfaces and parallel to their lateral surfaces, and the outer seal is positioned along the lateral surface of at least some of the multiple layers. The outer seal is composed of a flexible material and is arranged to bind the second layer and at least one other layer of the multiple layers. The outer seal also contains a non-adhesive liquid between the second layer and the at least one other layer of the multiple layers to allow relative sliding between at least two layers of the multiple layers. This relative sliding reduces the stiffness and stress to failure within a display stack-up having multiple layers, to enable greater flexibility than is currently available for display systems. As used herein, a flexible material, structure, system, or component, can be bent, or otherwise deformed, and return to its original shape.

FIG. 1 shows a pictorial diagram illustrating an electronic device 100 having, at or coupled to a front or face of the device 100, a flexible display stack-up 102, in accordance with some embodiments. The electronic device 100 is illustrated as a smartphone. However, the electronic device 100 can represent other types of handheld portable devices, such as a tablet, a phablet, or a personal digital assistant. Additionally, larger electronic devices such as laptop computers, computer display devices, and televisions can also be adapted to incorporate a flexible display stack-up, also referred to herein simply as a display stack-up, consistent with the present teachings.

Figure 2:
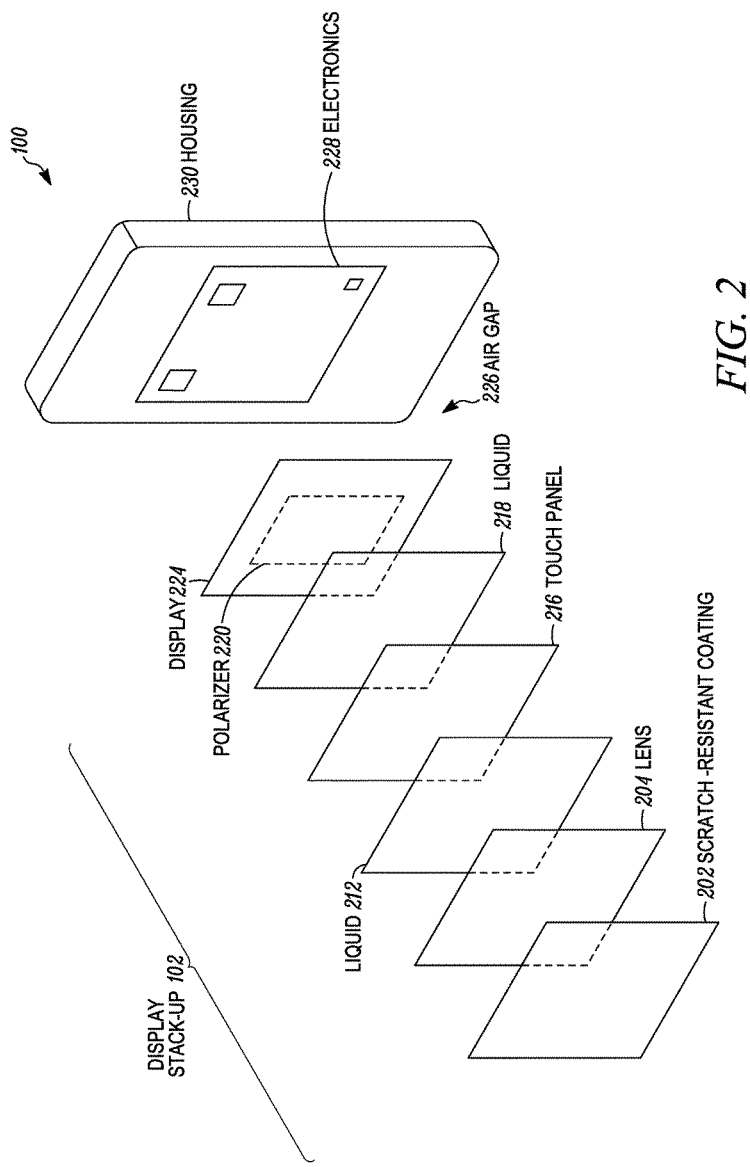
FIG. 2 shows an exploded pictorial diagram illustrating multiple layers of the flexible display stack-up of the electronic device shown in FIG. 1.

FIG. 2 shows an exploded pictorial diagram of the electronic device 100 illustrating example layers of the display stack-up 102. The electronic device 100 is shown as having a housing 230 that contains internal electronics 228, such as one or more integrated circuit chips having circuitry thereon for operating the electronic device 100. The display stack-up 102 is arranged at the front of the device 100 on top of the electronics 228 and includes multiple layers. For the illustrated embodiment, the display stack-up 102 is separated from the electronics 228 by an air gap 226. For example, the display stack-up 102 includes a perimeter attachment, such as an adhesive and/or mechanical attachment, to the housing 230 or a component within the housing 230, which leaves the air gap 226 between the display stack-up 102 and the electronics 228. For another embodiment, a different material such as a flexible support structure, e.g., a backplate, separates the display stack-up 102 from the internal electronics 228 and provides support for a display layer 224 within the display stack-up.

For a particular embodiment, the entire electronic device 100 is flexible to support concave and/or convex bending. Consequently, although concave bending is shown in some of the drawings, the present teachings can be applied to support convex bending of a display stack-up. Such flexibility of the device 100 can be through constructing at least portions of the device 100 using flexible material and by incorporating mechanisms that support local flexibility. For one example, the housing 230 is composed of a flexible material, for instance a polymer or polymer composite such as polyethylene terephthalate (PET), and the electronics 228 are arranged onto one or more flexible printed circuit boards. The housing 230 can also, or alternatively, incorporate a mechanism that facilitates local flexibility, such as a hinge-type or other mechanical mechanism. Additionally, each layer of the display stack-up 102 is composed of a flexible material, which can be plastic or another polymer, glass, ceramic, or a composite material such as a composite laminate. Although not shown, the electronic device 102 includes a flexible battery arrangement.

As shown, the multiple layers include, but are not limited to: the display layer 224, also referred to herein as a display; a touch panel 216; a lens layer or lens 204; and a scratch resistant coating 202, stacked as illustrated along an axis that is perpendicular to the face of the device 100. Namely, starting at the face of the electronic device 100 closest to the electronics 228 is the display 224, which can optionally have a polarizer layer 220 coupled thereon. The touch panel 216 is positioned next in the stack-up 102 followed by the lens 204 and the scratch-resistant coating 202 at the very top of the display stack-up 102.

Dispersed between and coupling at least some of the layers is liquid, e.g., 212, 218, in accordance with the disclosed embodiments. The liquid 212 is illustrated as being dispersed between the lens 204 and the touch panel 216, and the liquid 218 is illustrated as being dispersed between the touch panel 216 and the display 224. However, liquid can be dispersed between other layers such as between the display 224 and a support structure that separates the display 224 from the electronics 228.

Some layers of the display stack-up 102, such as the display 224 and the touch panel 216, can be contained within the device housing 230. Whereas, other layers may be coupled external to the housing 230, for instance by bonding the lens 204 and/or the scratch-resistant coating 202 to the top of the housing 230. Moreover, the thicknesses of at least one layer of the display stack-up 102 is sub-millimeter, i.e., less than one millimeter. For an example, the layers 202, 204, 216, 220, and 224 are or include thin-film laminate layers of material and/or thin-film laminate composites having a thickness in the order of microns, for instance 0.3 millimeters or less. However, at least some of the layers of a display stack-up for larger products, such as televisions and computer displays, can be thicker.

For a particular implementation, the thickness (t) of each layer is limited by equation 1 below.

$$t = 2 * R * e, \quad (1)$$

wherein R is the bend radius, and e is the strain criteria when damage starts, e.g., the yield strain or some other criterion. For example, for a portable device having a desired bend radius of 5 millimeters and a strain of less than two percent, the thickness of the layers should not exceed 0.2 millimeters. For other applications with a more forgiving bend radius, the thickness can scale accordingly.

A limited number of device components 202, 204, 212, 216, 218, 220, 224, 228 and 230 are shown for ease of illustration. Other embodiments include a lesser or greater number of such components in an electronic device. Moreover, other components needed for a commercial embodiment of an electronic device that incorporates the components 202, 204, 212, 216, 218, 220, 224, 228 and 230 are omitted from FIG. 2 for clarity in describing the enclosed embodiments.

With further regard to the layers of display stack-up 102, the display 224 can be any suitable single-sided or double-sided multi-layered display structure or assembly used to form illuminated images for viewing on a screen of the electronic device 100. Example displays include a liquid crystal display (LCD), a light emitting diode display (LED), and an organic light emitting diode display (OLED). The polarizer layer 220 acts as an optical filter to pass light of a specific polarization and block waves of other polarizations.

The touch panel 216 includes one or more conductive layers used to detect a user touching the display stack-up 102. For an embodiment, the touch panel layers are constructed with indium tin oxide (ITO) thin films. In other embodiments, a specialized polyester film, such as a PET film, is a part of the touch panel 216 to provide greater tensile strength and transparency for the whole display stack-up 102.

The lens 204 can be constructed from optical glass. In a particular implementation, the lens 204 is formed of resins and has a plano-concave structure. However, other implementations can use other types of glass or plastic and have different structures, such as plano-convex, cylindrical, or wide-angle macro lens structures. The electronic device 100 can include one or more additional lenses not shown. The scratch-resistant coating 202 is, for instance, an outer hard coating designed to prevent scratching and marring of the lens 204 during normal use.

Figure 3:
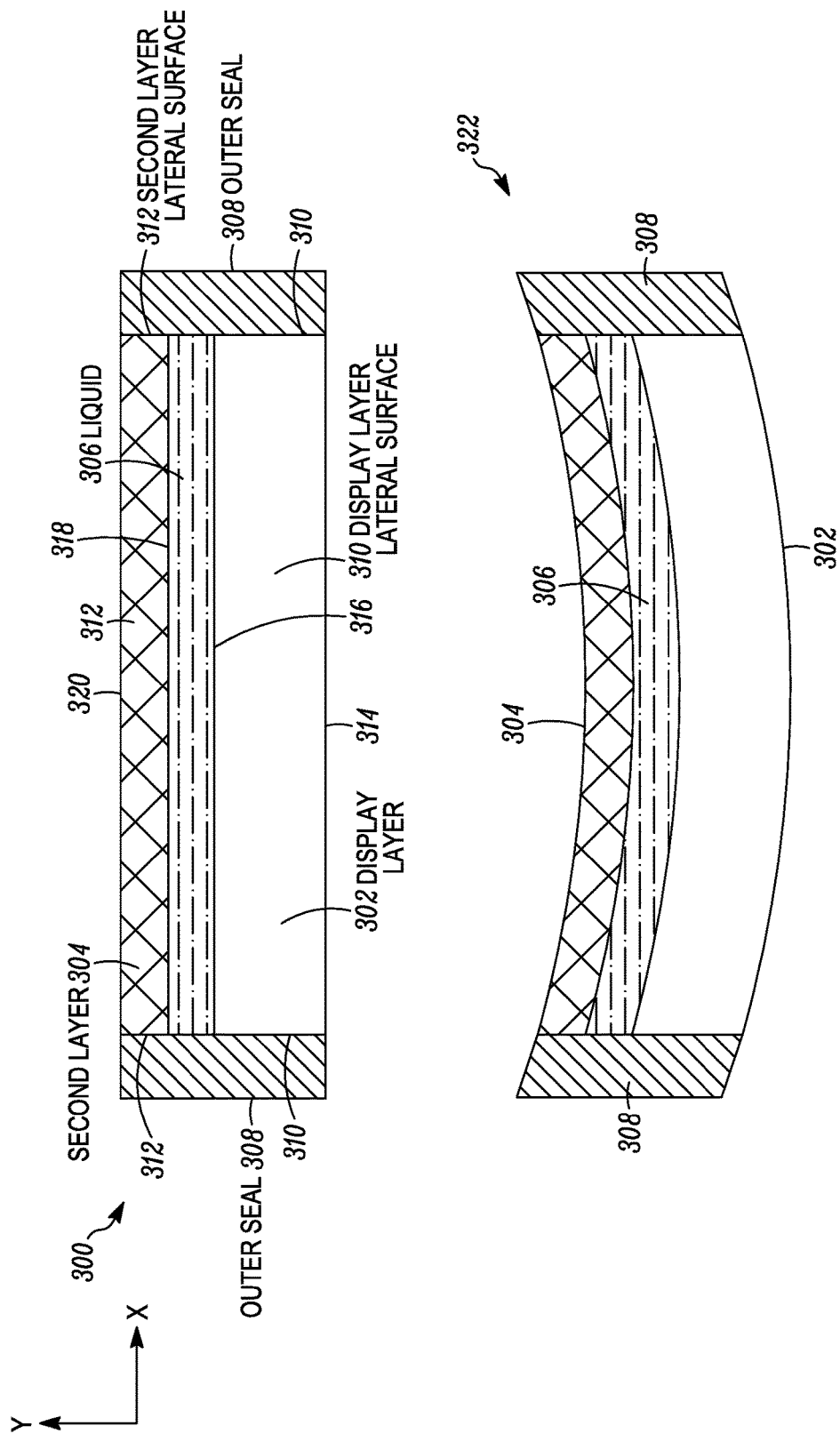
FIG. 3 shows a pictorial diagram illustrating two views of a flexible display stack-up in accordance with an embodiment.

FIG. 3 shows a pictorial diagram illustrating cross-sectional views of an embodiment of a display stack-up 300, or a portion thereof, with a mechanism for containing a liquid between two of its layers. More particularly, the display stack-up 300 includes: multiple layers, in this case a display layer 302 and a second layer 304, which can be a lens layer or a touch panel, for instance; an outer seal 308; and a non-adhesive liquid, or simply liquid, 306 contained by the outer seal 308.

Within a display stack-up according to the present teachings, each layer of the multiples layers has first and second base surfaces and a thickness therebetween that defines a height of a lateral surface at a periphery around a perimeter of the layer. Moreover, the multiple layers are stacked along an axis perpendicular to their base surfaces and parallel to their lateral surfaces. For the display stack-up 300, the display layer 302 has first 316 and second 314 base surfaces having a thickness therebetween that defines a height of a lateral surface 310 at a periphery of the display layer 302. Similarly, the second layer 304 has first 318 and second 320 base surfaces having a thickness therebetween that defines a height of a lateral surface 312 at a periphery of the second layer 304. The display layer 302 and second layer 304 are stacked along an axis (y-axis) perpendicular to their base surfaces and parallel to their lateral surfaces. For example, the y-axis is perpendicular to a face of an electronic device that includes the display stack-up 300.

Further for a display stack-up according to the present teachings, the outer seal is positioned along the lateral surface of at least some of the multiple layers of the display stack-up. The outer seal is constructed from a flexible material and is arranged to bind the second layer and at least one other layer of the multiple layers. Additionally, the non-adhesive liquid is contained by the outer seal between the second layer and the at least one other layer of the multiple layers to allow relative sliding between at least two layers of the multiple layers.

For the illustrated display stack-up 300, the outer seal 308 is arranged or positioned along the lateral surface of the display layer 302 and the second layer 304 and is arranged to bind the layers 302 and 304 at their peripheries. Thus, as shown, the at least one other layer bound with the second layer 304 by the outer seal 308 is the display layer 302. For another embodiment, the outer seal 308 binds one or both of the layers 302, 304 near its periphery, for instance at an edge of a base surface at or near the periphery, as illustrated for instance in other figures. For a further embodiment, the outer seal 308 is constructed using a flexible material such as an elastomer, for instance a natural rubber or silicon. A portion or segment of the outer seal 308 includes some type of bonding material or agent, such as an adhesive, to hold the layers 302 and 304 in place by restricting sliding of the layers 302 and 304, relative to the outer seal 308, along the y-axis of which these layers are stacked. The adhesive, thereby, resists the separation of the layers 302 and 304 from the outer seal 308 to capture, seal, or contain the liquid 306 therebetween.

The liquid 306 is characterized as a non-adhesive liquid to distinguish the liquid 306 from adhesives that may have an initial liquid phase but harden into a solid to facilitate the binding properties of the adhesive. For an embodiment, the liquid 306 is an optically clear liquid with a refractive index or index of refraction that is within the range of the refractive indices of the materials used to construct the layers of the display stack-up 300, to avoid diffraction patterns and reflection at the surface of the layers. For a particular embodiment, the index of refraction of the liquid 306 is in the range of 1.3 to 1.6. Example liquids include, but are not limited to, optical oil and optical silicon, such as aromatic siloxane and fluorosilicon.

Accordingly, a liquid is defined herein as a nearly incompressible fluid that is able to flow and take or conform to the shape of a container. As opposed to permanently or semi-permanently tying the layers 302 and 304 together, at their respective base surfaces 316 and 318, the liquid 306 couples the layers 302 and 304 together by a wetting phenomena resulting from a surface tension or force, which is characteristic of liquids. Moreover, the liquid 306 allows relative shearing or sliding between the layers 302 and 304. This enables the display stack-up 300 to bend, e.g., along the y-axis for instance as shown in view 322, at a tighter radius without breaking than is possible if the layers 302 and 304 were bonded together by an adhesive. For an implementation, stiffness of the stack-up 300 can be reduced by a factor of four and stress on the layers' surfaces by a factor of two by bonding the layers 302 and 304 using the liquid 306 instead of an adhesive.

As a consequence of the relative sliding of the layers 302 and 304, there is an extension difference or deformity at the interface of the outer seal 308 and the layers 302 and 304. This deformity can be accommodated, at least to some extent, by the flexibility of the outer seal 308. To further facilitate additional bending of the display-stack-up, for another embodiment, the peripheries of the second layer, e.g., 304, and the at least one other layer bound to the second layer by the outer seal, e.g., 308, are laterally offset. Additionally, the outer seal 308 can be shaped to accommodate this lateral offset to allow deforming over a longer area. Such an embodiment is illustrated by reference to FIG. 4.

Figure 4:
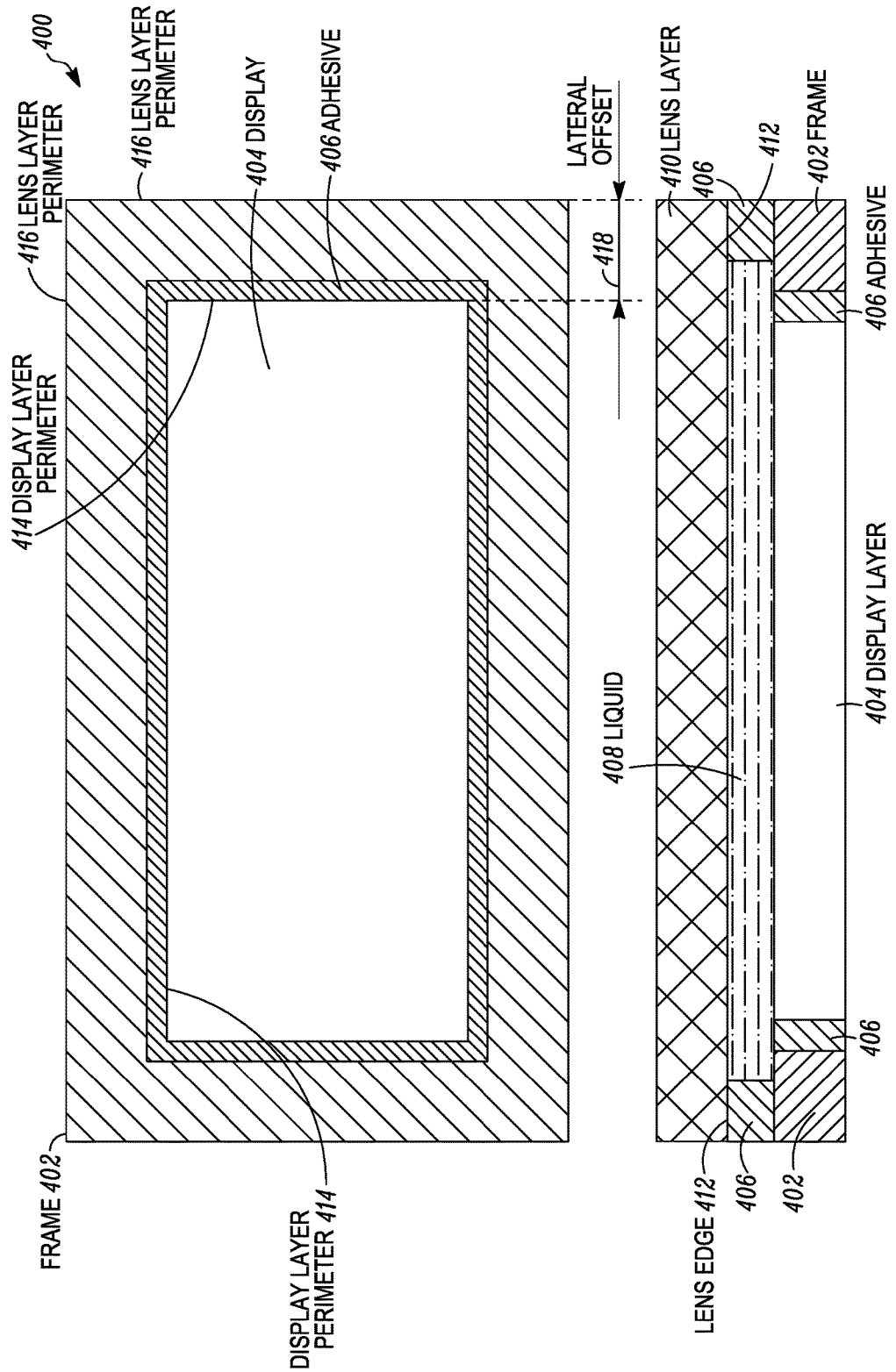
FIG. 4 shows a pictorial diagram illustrating two views of a flexible display stack-up in accordance with an embodiment.

FIG. 4 shows a pictorial diagram of a top-down view and a cross-sectional view of a display stack-up 400 in accordance with an embodiment. The display stack-up 400 includes: a display layer 404 having a perimeter 414; a second layer, which in this case is a lens 410 layer having a perimeter 416; and an outer seal. As shown, a surface area of base surfaces of the lens layer 410 is larger than a surface area of base surfaces of the display layer 404, thereby creating a lateral offset 418 between the respective perimeters 416, 414 of the layers 410, 404. For one implementation example, for two materials of thickness (t) to slide relative to each other around a bend radius (R), the lateral offset is 1.5*t.

For the embodiment shown, the outer seal is a frame structure or frame 402 having a shape that conforms to and compensates for the offset 418 between the perimeters 414, 416 of the layers 404, 410 in order to seal or contain a liquid 408 between the display layer 404 and the lens layer 410. Accordingly, the frame 402 is composed of an elastomer, for example, wherein one portion 406 along a first length of the frame 402 is bonded to a lateral surface at the periphery of the display layer 404; and another portion 406 along a second length of the frame 402 is bonded to an end 412 of a base surface of the lens layer 410. For a particular embodiment, the portions 406 of the frame 402 have adhesive properties to resist the separation of the frame 402 from the layers 404 and 410.

The adhesive portions 406 are depicted as having a different material composition from the remaining portions of the frame 402. However, the frame 402 (including the portions 406) can be a single integral structure or element constructed to have or exhibit different material properties along different portions of the frame 402. Additionally, to conform to the offset 418 between the perimeters 414, 416 of the layers 404, 410, the frame 402 has a cross-sectional shape of an "L." This allows sliding between the display layer 404 and the lens layer 410, as a consequence of the liquid 408 sealed therebetween, without imposing unnecessary stresses to the display 404/lens 410 interface when the display stack-up 400 is bent. For an embodiment, the frame 402 is part of the housing of an electronic device for which the display stack-up 400 is a component. Therefore, the frame 402 also conforms to a shape of the front or face and the sides of the electronic device.

FIGS. 3 and 4 each illustrate a different embodiment of a display stack-up, or portion thereof, having a display layer and one other layer. However, FIGS. 5, 6, and 7 each illustrate a different embodiment of a display stack-up having a display layer and a plurality of other layers. At least some of the display stack-up layers are bound together at or near their peripheries to seal liquid between some of the layers.

Figure 5:
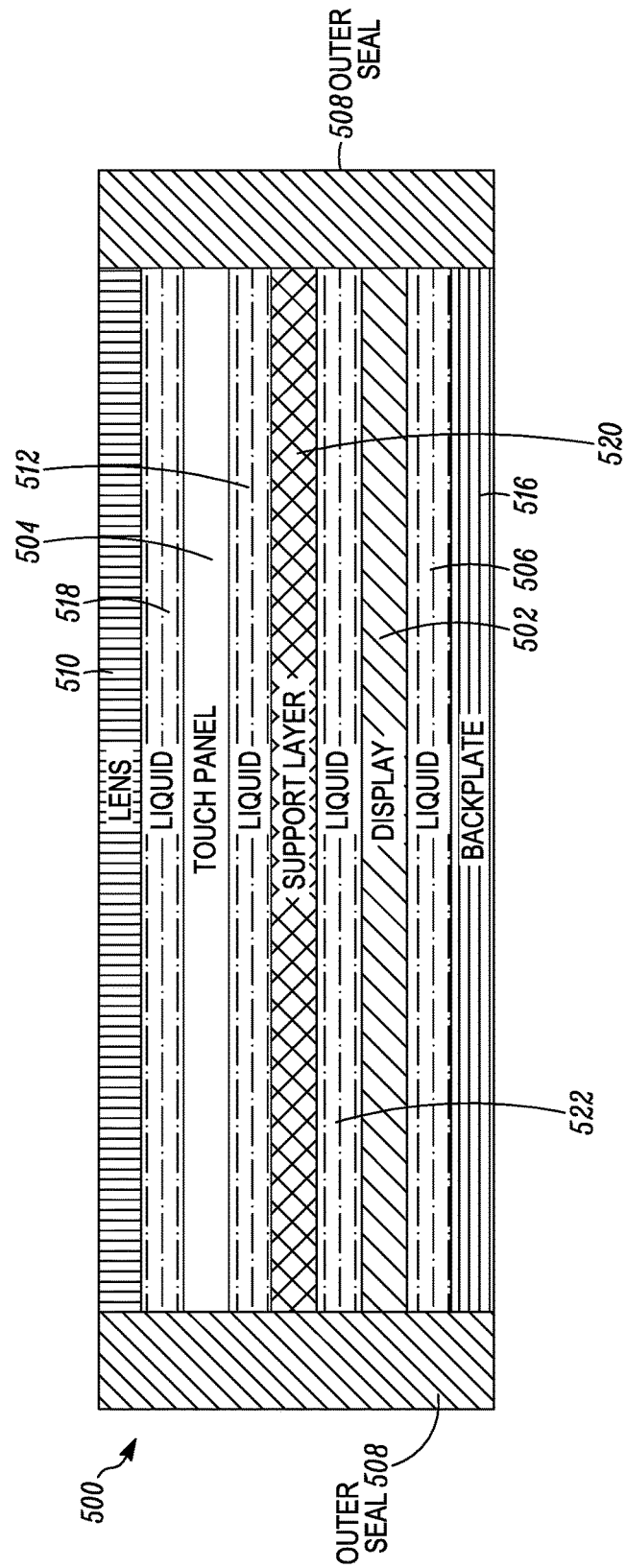
FIG. 5 shows a pictorial diagram illustrating a cross-sectional view of a flexible display stack-up in accordance with an embodiment.

Namely, a display stack-up 500 shown in FIG. 5 includes multiple layers and an outer seal 508, which is bonded to lateral surfaces of all the layers to contain or seal liquid between at least some of the layers. As shown, the multiple layers include a support layer, referred to as a backplate, 516, which can be positioned closest to internal electronics of an electronic device housing the display stack-up, and a lens 510, which can be positioned farthest from the internal electronics. Between these two layers 516, 510 are additional layers depicted as a display 502 and a touch panel 504, which is positioned between the display 502 and the lens 510.

For an embodiment, the backplate 516 provides support for and separates the display 502 from internal electronics of an electronic device. For at least one other embodiment, the display stack-up 500 includes one or more additional support layers, e.g., for the display 502, which can be positioned between the display 502 and the lens and/or positioned between the display 502 and the backplate 516. One such additional support layer is illustrated in FIG. 5 at 520. The layers 516, 502, 520, 504, and 510 are stacked along an axis parallel to the lateral surfaces of all the layers and perpendicular to base surfaces of the layers.

The outer seal 508 contains liquid that is judiciously dispersed between the layers of the display stack-up 500 to facilitate a desired bend radius for the display stack-up. For example, as shown, liquid 506 is sealed between the backplate 516 and the display 502. Liquid 522 is sealed between the display 502 and the support layer 520. Liquid 512 is sealed between the support layer 520 and the touch panel 504. Liquid 518 is sealed between the touch panel 504 and the lens 510. The liquid 506, 512, 518, and 522 can be the same type or different types of liquids that satisfy the refractive index requirements.

Figure 6:
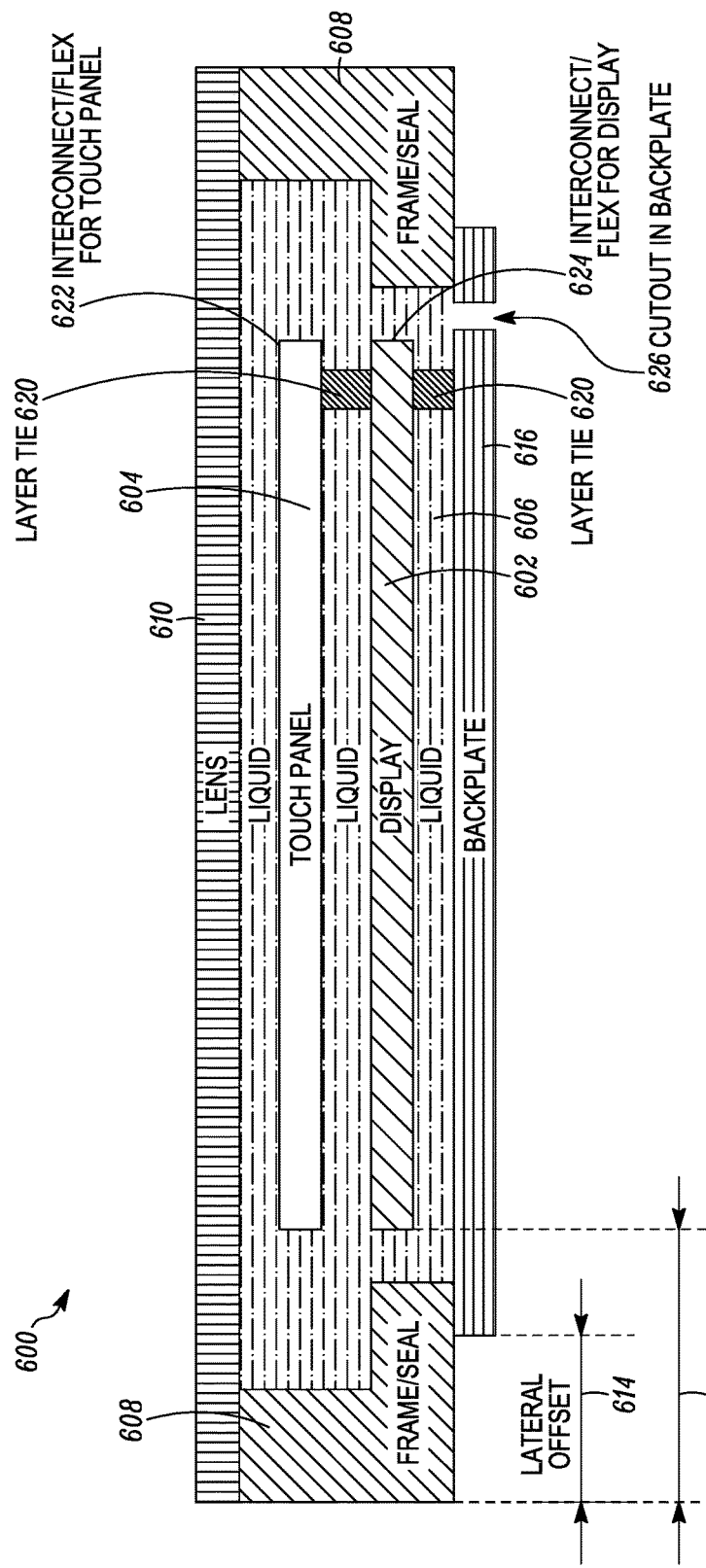
FIG. 6 shows a pictorial diagram illustrating a cross-sectional view of a flexible display stack-up in accordance with an embodiment.
Figure 7:
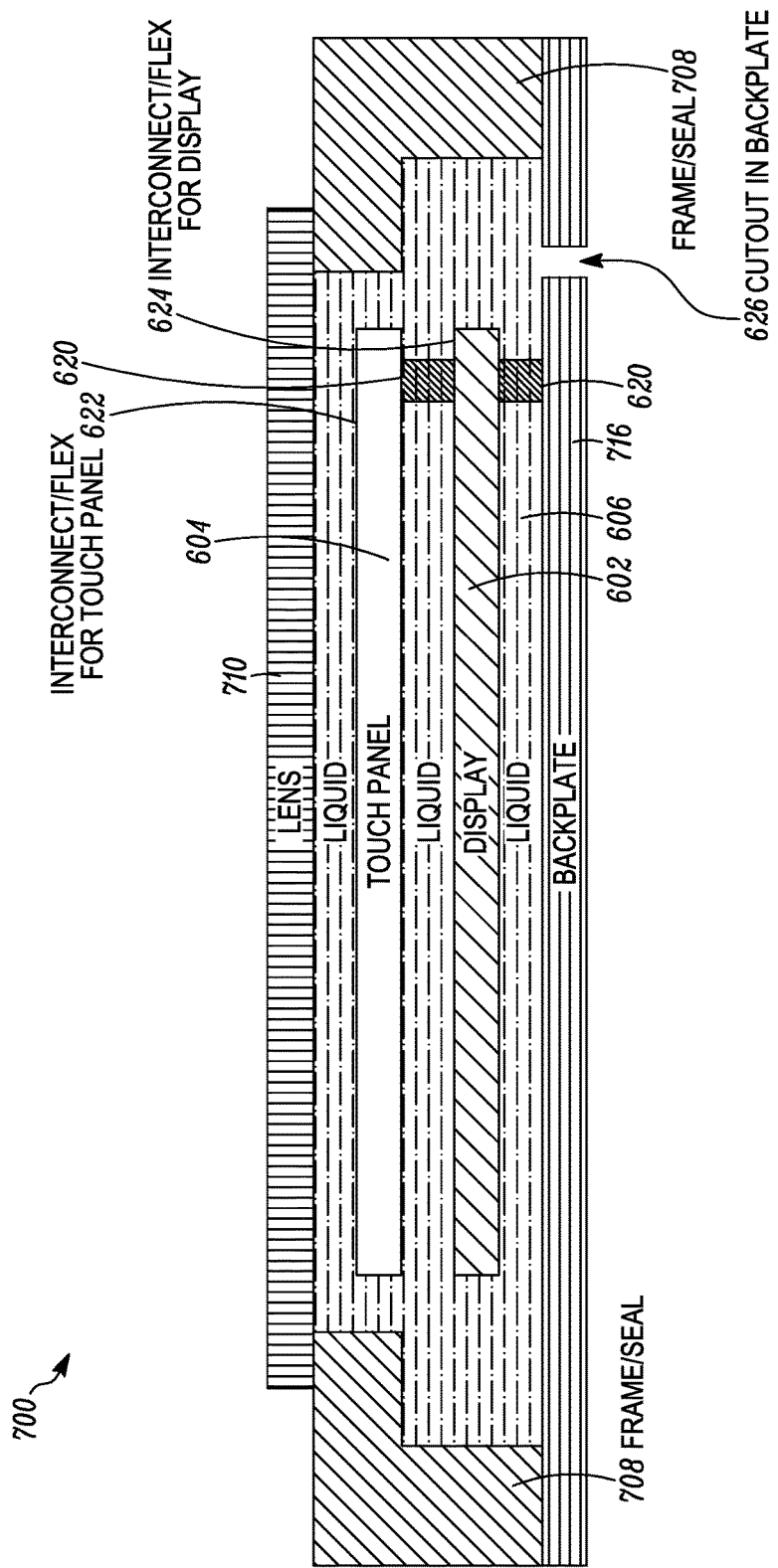
FIG. 7 shows a pictorial diagram illustrating a cross-sectional view of a flexible display stack-up in accordance with an embodiment.

In FIGS. 6 and 7, the outer seal of the illustrated display stack-up is a frame structure arranged to bind a second layer (to a display layer), e.g., a lens, and at least one other layer, e.g., a backplate, at or near their peripheries and to enclose any remaining layers of the multiple layers of the display stack-up. Namely, a display stack-up 600 of FIG. 6 includes a lens 610 and a backplate 616 that are bonded together by a frame/seal structure 608 positioned at an edge of a base surface and at a periphery of the lens 610 and the backplate 616, to seal in a liquid 606 and to enclose remaining layers, depicted as a display 602 and a touch panel 604. Similarly, a display stack-up 700 of FIG. 7 includes a lens 710 and a backplate 716 that are bonded together by a frame/seal structure 708 positioned at an edge of a base surface and at a periphery of the lens 710 and the backplate 716, to seal in the liquid 606 and to enclose the remaining layers 602 and 604.

In both display stack-ups 600, 700, the periphery of the lens 610, 710 is laterally offset from the periphery of the backplate 616, 716, an example of which is as depicted in FIG. 6 as a lateral offset 614. Accordingly, the frame/seal structures 608, 708 have an "L" shape to accommodate and conform to this lateral offset.

A difference between the display stack-ups 600, 700 is the positioning of the frame/seal structure relative to the lens and backplate. More particularly, in FIG. 6, the lens 610 is longer than the backplate 616. Accordingly, the base surface of the lens 610 extends completely over the frame/seal structure 608 such that the edge of the lens 610 is aligned with one edge of the frame/seal structure 608. However, another edge of the frame/seal structure 608 overlaps the edge of the backplate 616. By contrast in FIG. 7, the backplate 716 is longer than the lens 710. Accordingly, the edge of the backplate 716 is aligned with one edge of the frame/seal structure 708, and the edge of the lens 710 overlaps another edge of the frame/seal structure 708. A benefit of the arrangement of the frame/seal structures 608, 708 can be realized when the thickness of layers is on the order of microns. In such a scenario, attaching the outer seal to the base surface of the layers instead of the lateral surface of the layers can provide a more robust bond due to a greater bonding surface area.

Regarding additional similarities between display stack-ups 600, 700, the display 602 is positioned between the between the lens 610, 710 and the backplate 616, 716, and the periphery of the display 602 is laterally offset from the periphery of at least one of, and in this case both, the lens 610, 710 and the backplate layer 616, 716, which are bound by the outer seal 608, 708. An example of the lateral offset between the display 602 and the lens 610 is depicted as a lateral offset 630.

The lateral offset between the periphery of the display layer 602 and the peripheries of both the lens and backplate allows the display 602 to be enclosed by the frame/seal structure 608, 708 and surrounded by the liquid 606. In the illustrated embodiments, at least one other non-display layer, e.g., the touch panel 604, is laterally offset at its periphery from the peripheries of both the lens 610, 710 and the backplates 616, 716, and is, thereby, enclosed by the frame/seal structure 608, 708 and surrounded by the liquid 606. Having the enclosed layers surrounded by the liquid provides additional flexibility in meeting bend radius requirements. Additional lens and/or optical layers (not shown) can be positioned between the display 602 and lens layers 610, 710 and surrounded by the liquid 606, in other embodiments. Similarly, additional support structures (not shown) can be positioned between the display 602 and the backplate 616, 716 and surrounded by the liquid 606, in other embodiments.

For a particular embodiment, one or both of the enclosed layers 602, 604 are tied to at least one of the layers that is bound to the frame/seal structure 608, 708. This provides additional control over the movement the layers 602, 604 within the liquid such that operation of the display 602 and/or touch panel 604 is not compromised. As illustrated, the display 602 is tied, connected, or otherwise bound to the backplate 616, 716 using a layer tie 620. Similarly, the touch panel 604 is tied, connected, or otherwise bound to the display 602 using a layer tie 620. The layer ties 620 can be suitable adhesives, for instance.

Further for the embodiments shown, since the touch panel 604 and display 602 are immersed in the liquid, an interconnect or flex 624 electrically connects the display 602 to internal electronic components of an electronic device through a cutout 626 in the backplate 616, 716. Likewise, an interconnect or flex 622 electrically connects the touch panel 604 to internal electronic components of the electronic device through the cutout 626 in the backplate 616, 716. The cutout 626 is sealed after the display stack-up 600, 700 is assembled to prevent loss of the liquid 606 therein.

Figure 8:
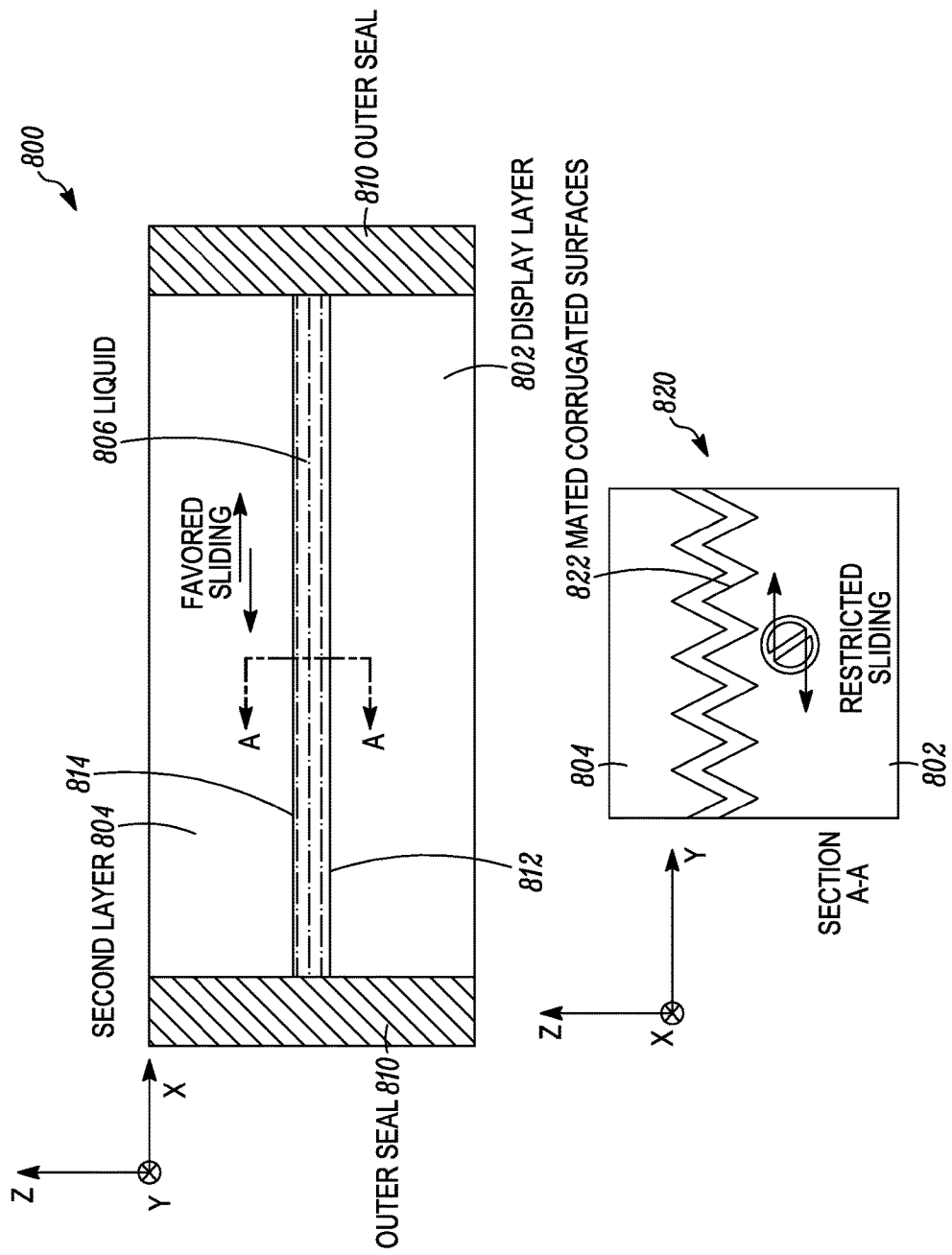
FIG. 8 shows a pictorial diagram illustrating two views of a flexible display stack-up in accordance with an embodiment.

For some applications there may be a desire to create an orthotropic slipping behavior between two layers having the liquid sealed therebetween to favor bending along one axis and restrict or provide a higher resistance to bending along an orthogonal planar axis. For example, a manufacturer of tablets may desire the tablet to fold over relative to a centerline to be used as a cell phone but make the tablet stiffer along a perpendicular axis. FIG. 8 illustrates a mechanism for creating such an orthotropic slipping behavior between layers.

FIG. 8 shows a pictorial diagram illustrating a display stack-up 800 having at least two layers, e.g., a display layer 802 and a second layer 804, bound together by a flexible outer seal 810 to seal or contain a liquid 806 between the layers 802 and 804. For this embodiment, respective base surfaces 812, 814 of the layers 802 and 804, which are coupled by the liquid 806, are configured to allow the relative sliding along a first direction, orientation, or axis and to restrict relative sliding along a second direction, orientation, or axis.

For example, the layers 802 and 804 are configured with a mated pattern, such as mated corrugated surfaces with a series of parallel ridges and furrows, to allow the relative sliding along the first direction and to restrict relative sliding along the second direction. A cross-sectional slice A-A through the layers 802 and 804 along a y-z plane is shown in a view 820, which illustrates mated corrugated surfaces 822 of the base surfaces 812, 814 of the layers 802 and 804. Accordingly, the mated corrugated surfaces 822 favor sliding along the x-axis and correspondingly favor bending along an x-z plane. Conversely, the ridges of the mated corrugated surfaces 822 restrict sliding along the y-axis and correspondingly restrict bending along the y-z plane.

For one embodiment, the patterned surfaces 822 are realized by applying mated patterned films, such as thin-film plastic laminates with prismatic grooves, to the base surfaces 812, 814. For another embodiment, the patterned surfaces 822 are realized by a corrugated etching within the base surfaces 812, 814, using any suitable etching technique such as photo-etching. For still another embodiment, the patterned surfaces 822 are a consequence or orthotropic properties of one or more of the layers. For one example, a plastic used to construct a layer has composite fibers that facilitate sliding in a particular direction but not in another direction. Moreover, FIG. 8 illustrates mated corrugated surfaces as one example. However, the mated pattern can be any suitable pattern that creates an orthotropic slipping behavior between two layers coupled by a liquid.

In some applications, surface and internal liquid attractive forces balance the thickness of the liquid, and thereby the spacing or gap, between layers of a display stack-up. However, where such is not possible simply by virtue of the liquid's properties, for instance for certain types of liquids used, FIG. 9 illustrates embodiments that can be implemented to create a substantially uniform, constant, and/or consistent thickness throughout the liquid so that the liquid doesn't get squeezed during bending.

Figure 9:
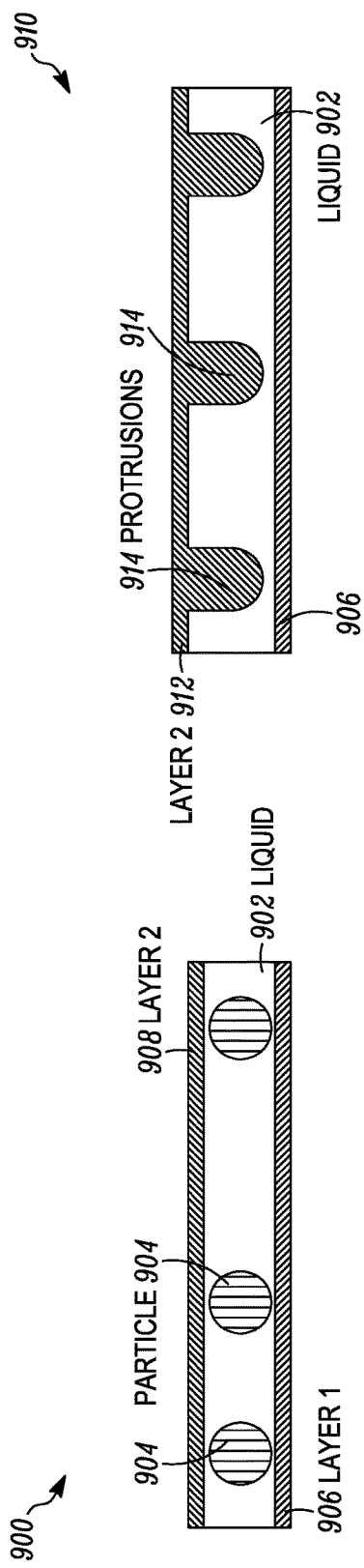
FIG. 9 shows a pictorial diagram illustrating a flexible display stack-up in accordance with an embodiment.

For a first embodiment, illustrated in FIG. 9, a display stack-up 900 includes layers 906 and 908 having a liquid 902 therebetween. The stack-up 900 also includes a plurality of particles 904 distributed within the liquid 902 to create a uniform spacing between the layers 906 and 908. For a particular implementation, the particles 904 are on the order of microns and are thereby deemed microparticles. For example, the microparticles are spacers such as plastic, glass, or ceramic microspheres. The spacers can have any suitable shape, however, and be composed of any suitable material. Moreover, for larger display stack-ups, the particles may be larger and/or the liquid may have a larger volume of the particles.

For a second embodiment, illustrated in FIG. 9, a display stack-up 910 includes layers 906 and 912 having the liquid 902 therebetween. For this embodiment, the substantially constant gap between the layers is created by at least one of the layers having a plurality of protrusions that extend into the liquid between the layers. As shown, the layer 912 includes a plurality of protrusions 914 coupled to at least one of its base surfaces, wherein the plurality of protrusions 914 extend into the non-adhesive liquid 902. The protrusions 914 can be manufactured as an integral part of the surface of the layer 912, such as by etching, or applied as a laminate film, for instance, to the surface. Although, the protrusions 914 are shown as being at least partially rounded, they can have any suitable shape that enables a substantially consistent gap between the layers 906, 912.

Figure 10:
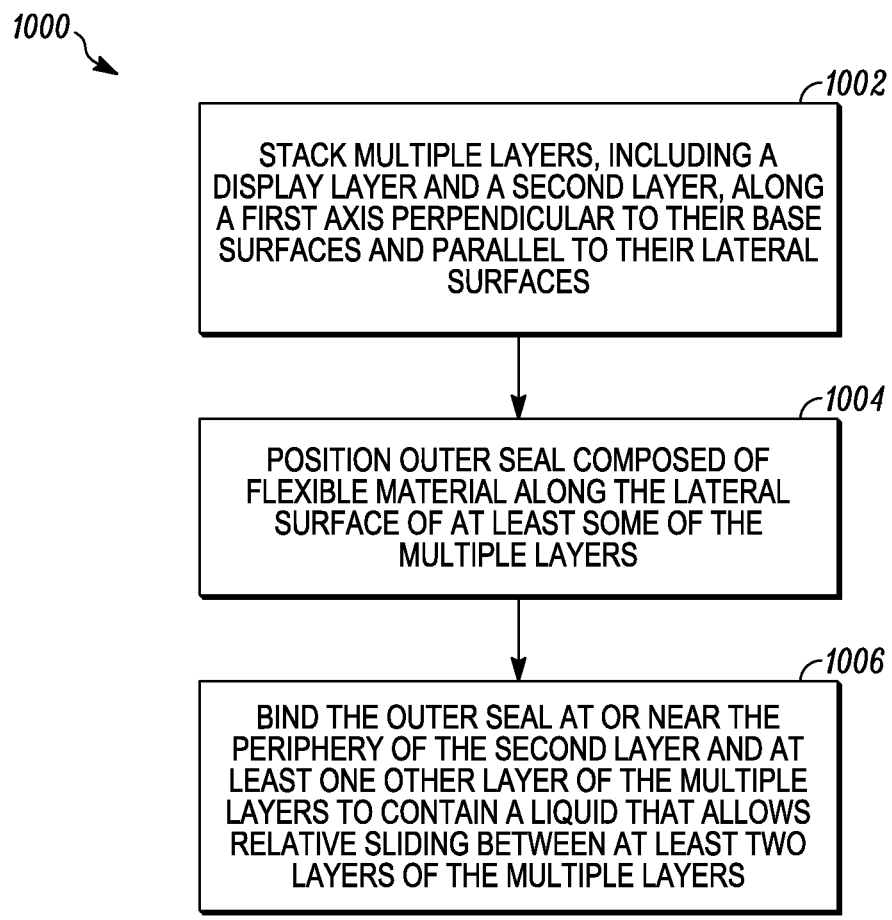
FIG. 10 shows a flow diagram illustrating a method of arranging a flexible display stack-up in accordance with an embodiment.

FIG. 10 shows a flow diagram illustrating a method 1000 of arranging a flexible display stack-up in accordance with an embodiment. The method 1000 can, for instance, be incorporated into any suitable process for making flexible stack-ups for electronic devices, such a process using thin-film laminate technology. The method 1000 can also be applied to larger-scale manufacturing technologies such as those used in manufacturing televisions.

Method 1000 includes stacking 1002 multiple layers, including a display layer and a second layer, with each having first and second base surfaces and a thickness therebetween that defines a height of a lateral surface at a periphery of the layer. The layers can have dimensions as earlier described and are stacked along an axis perpendicular to their base surfaces and parallel to their lateral surfaces. The method also includes positioning 1004 an outer seal constructed from flexible material along the lateral surface of at least some of the multiple layers. Example positioning is shown and described, for example, by reference to FIGS. 3 through 7. The method also includes binding 1006, for instance using an adhesive or a material with adhesive properties, the outer seal at or near the periphery of the second layer and at least one other layer of the multiple layers to contain a non-adhesive liquid that allows relative sliding between at least two layers of the multiple layers.

In the foregoing specification, specific embodiments have been described. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of present teachings.

The benefits, advantages, solutions to problems, and any element(s) that cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Moreover, in this document, relational terms such as first and second, top and bottom, and the like are used solely to distinguish one entity or action from another entity or action without necessarily requiring or implying any actual such relationship or order between such entities or actions. The terms "comprises," "comprising," "has," "having," "includes," "including," "contains," "containing" or any other variation thereof, are intended to cover a non-exclusive inclusion, such that a process, method, article, or apparatus that comprises, has, includes, contains a list of elements does not include only those elements; but also includes other elements not expressly listed or inherent to such process, method, article, or apparatus. An element proceeded by "comprises . . . a," "has . . . a," "includes . . . a," or "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially," "essentially," "approximately," "about" or any other version thereof, are defined as being close to as understood by one of ordinary skill in the art, and in one non-limiting embodiment the term is defined to be within 10%, in another embodiment within 5%, in another embodiment within 1% and in another embodiment within 0.5%. The term "coupled" as used herein is defined as connected, although not necessarily directly and not necessarily mechanically. A device or structure that is "configured" in a certain way is configured in at least that way, but may also be configured in ways that are not listed.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

We claim:

1. A display stack-up comprising:
   multiple layers comprising a display layer and a second layer, wherein each layer of the multiples layers comprises a flexible material that enables each layer to bend, and each layer has first and second base surfaces and a thickness there between that defines a height of a lateral surface at a periphery of a respective layer, wherein the multiple layers are stacked along an axis perpendicular to their base surfaces and parallel to their lateral surfaces;
   an outer seal positioned along the lateral surface of at least some of the multiple layers, wherein the outer seal comprises a flexible material, and the outer seal is arranged to bind to the second layer and bind to at least one other layer of the multiple layers;
   a non-adhesive liquid, contained by the outer seal between the second layer and the at least one other layer of the multiple layers, to allow relative sliding between at least two layers of the multiple layers that reduces a stiffness and stress of failure within the display stack-up when the display stack-up is bent.

2. The display stack-up of claim 1, wherein the thickness of at least one layer of the multiple layers is sub-millimeter.

3. The display stack-up of claim 1, wherein the outer seal is arranged to bind to the second layer at or near a periphery of the second layer, and the outer seal is arranged to bind to the at least one other layer at or near a periphery of the at least one other layer.

4. The display stack-up of claim 3, wherein the periphery of the second layer and the periphery of the at least one other layer bound by the outer seal are laterally offset.

5. The display stack-up of claim 4, wherein the at least one other layer bound by the outer seal comprises the display layer.

6. The display stack-up of claim 4, wherein the display layer is positioned between the second layer and the at least one other layer bound by the outer seal, and wherein the periphery of the display layer is laterally offset from the periphery of one or both of the second layer and the at least one other layer bound by the outer seal.

7. The display stack-up of claim 1, wherein the outer seal comprises a frame structure arranged to:
   bind to the second layer at or near a periphery of the second layer and bind to the at least one other layer at or near a periphery of the at least one other layer, and enclose any remaining layers of the multiple layers.

8. The display stack-up of claim 7, wherein the display layer is enclosed by the frame structure and surrounded by the non-adhesive liquid.

9. The display stack-up of claim 8, wherein the display layer is tied to at least one of the layers bound to the frame structure.

10. The display stack-up of claim 8, wherein the multiple layers comprises at least one other non-display layer enclosed by the frame structure and surrounded by the non-adhesive liquid.

11. The display stack-up of claim 1, wherein the second layer comprises a lens layer.

12. The display stack-up of claim 11, wherein the at least one other layer bound to the outer seal comprises a support layer, and the display layer is positioned between the lens layer and the support layer.

13. The display stack-up of claim 11, wherein the multiple layers comprise one or both of a touch panel or a support layer positioned between the display layer and the lens layer.

14. The display stack-up of claim 1, wherein the at least two layers of the multiple layers are configured to allow the relative sliding along a first direction and to restrict relative sliding along a second direction.

15. The display stack-up of claim 14, wherein the at least two layers are configured with mated corrugated surfaces to allow the relative sliding along the first direction and to restrict the relative sliding along the second direction.

16. The display stack-up of claim 15, wherein the mated corrugated surfaces of the at least two layers comprise at least one of a corrugated film applied to the base surface of the layer or a corrugated etching within the base surface of the layer.

17. The display stack-up of claim 1 further comprising a plurality of particles distributed within the non-adhesive liquid.

18. The display stack-up of claim 17, wherein the plurality of particles comprises microparticles.

19. The display stack-up of claim 1, wherein at least one layer of the multiple layers comprises a plurality of protrusions coupled to at least one its base surfaces, wherein the plurality of protrusions extend into the non-adhesive liquid.

20. A method for arranging a display stack-up, the method comprising:
    stacking multiple layers, comprising a display layer and a second layer, with each of the multiple layers comprising a flexible material that enables each layer to bend, and each layer having first and second base surfaces and a thickness therebetween that defines a height of a lateral surface at a periphery of a respective layer, wherein the multiple layers are stacked along an axis perpendicular to their base surfaces and parallel to their lateral surfaces;
    positioning an outer seal comprising another flexible material along the lateral surface of at least some of the multiple layers;
    binding the outer seal at or near the periphery of the second layer; and
    binding the outer seal at or near the periphery of at least one other layer of the multiple layers to contain a non-adhesive liquid that allows relative sliding between the second layer and the at least one other layer of the multiple layers, the non-adhesive liquid reduces a stiffness and stress of failure within the display stack-up when the display stack-up is bent.

* * * * *